United States Patent

Inagaki et al.

[11] Patent Number: 5,134,298
[45] Date of Patent: Jul. 28, 1992

[54] BEAM CONTROL METHOD AND APPARATUS

[75] Inventors: Akira Inagaki; Ryuichi Funatsu; Yasuhiko Nakayama, all of Yokohama, Japan

[73] Assignee: Hitachi, Ltd., Tokyo, Japan

[21] Appl. No.: 668,099

[22] Filed: Mar. 12, 1991

[30] Foreign Application Priority Data

Mar. 15, 1990 [JP] Japan .................................. 2-62679

[51] Int. Cl.$^5$ ............................................. G01N 21/13
[52] U.S. Cl. .............................. 250/491.1; 250/492.2
[58] Field of Search .......... 250/491.1, 492.1, 492.2 R, 250/561, 201, 548; 356/399, 400

[56] References Cited

U.S. PATENT DOCUMENTS

| | | | |
|---|---|---|---|
| 4,334,139 | 6/1982 | Wittekock et al. | 250/491.1 |
| 4,356,392 | 10/1982 | Wittekock et al. | 250/201.04 |
| 4,451,738 | 5/1984 | Smith | 250/491.1 |
| 4,698,513 | 10/1987 | Tojo et al. | 250/561 |
| 4,777,641 | 10/1988 | Inagaki et al. | 250/491.1 |
| 4,823,012 | 4/1989 | Kosugi | 250/491.1 |
| 4,823,014 | 4/1989 | Miyawaki | 250/561 |
| 4,849,901 | 7/1989 | Shimizu | 250/491.1 |
| 4,866,262 | 4/1989 | van der Werf et al. | 250/201.4 |

OTHER PUBLICATIONS

Katsuhiro Harada, "Current Status of E-Beam Lithography", Bull. Japan Soc. of Prec. Engg., vol.22, No. 4, Dec. 1988, pp. 256-262, (Provided in English).

Primary Examiner—Jack I. Berman
Assistant Examiner—Kiet T. Nguyen
Attorney, Agent, or Firm—Fay, Sharpe, Beall, Fagan, Minnich & McKee

[57] ABSTRACT

A beam control method and apparatus for processing a specimen. A specimen is irradiated with a first beam capable of modifying a property of the specimen. Subsequently, a second beam, incapable of modifying a property of the specimen, irradiates the trace formed by the first beam to thereby identify the actual position of the trace by detecting a signal representing the actual position of the trace. On the basis of comparing actual position of the trace with a desired position of the trace, the latter is controlled.

16 Claims, 10 Drawing Sheets

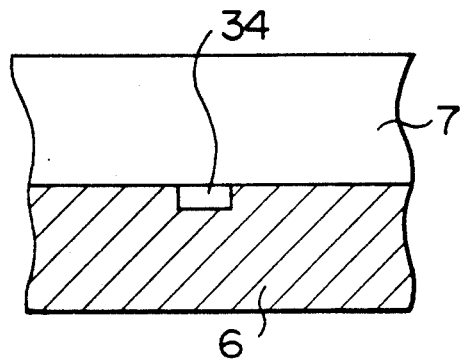
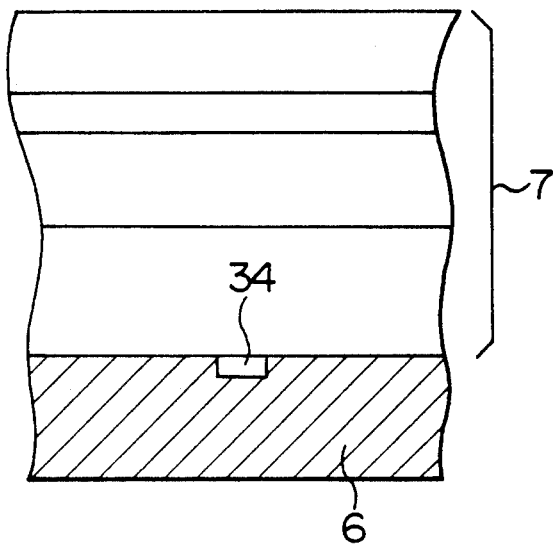
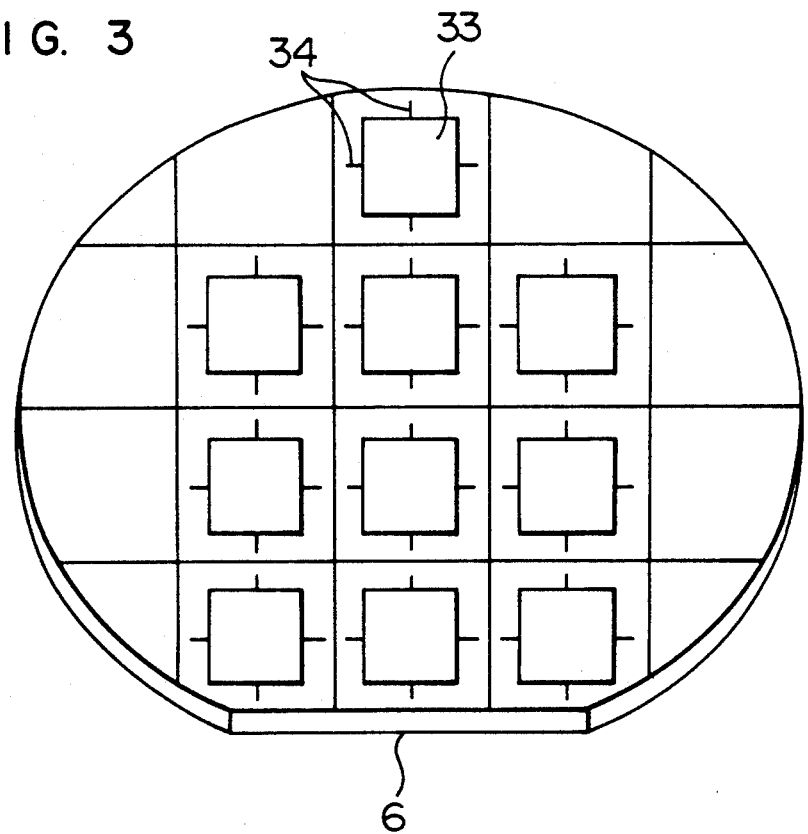

F I G. 8A
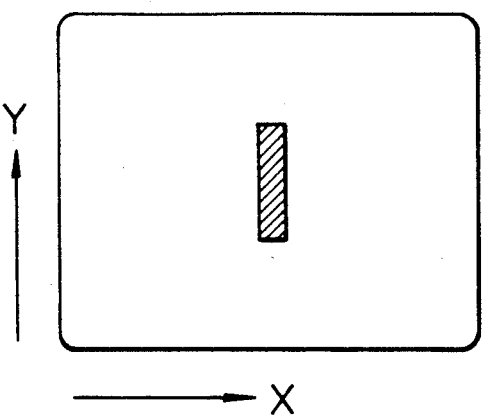
F I G. 8B
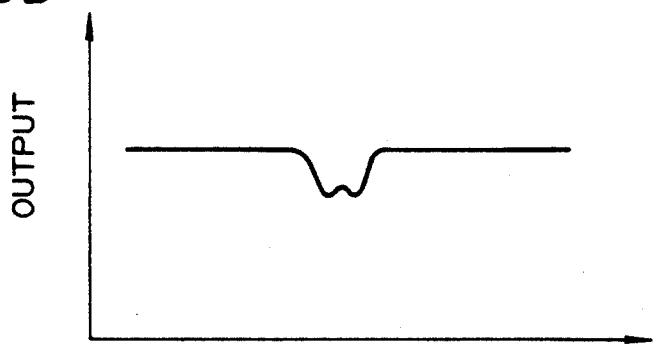
F I G. 9
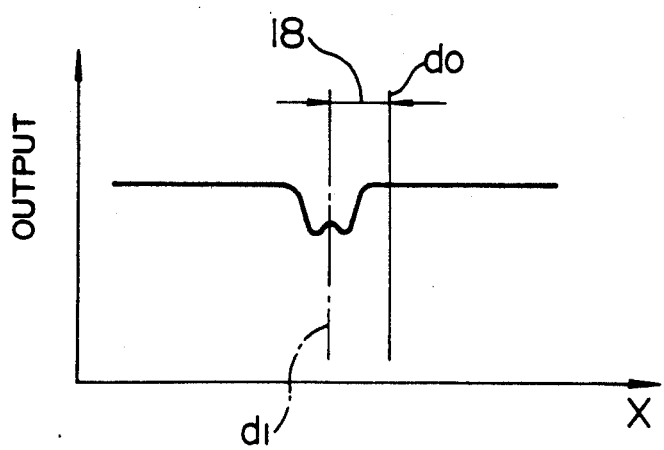

F I G. 12A
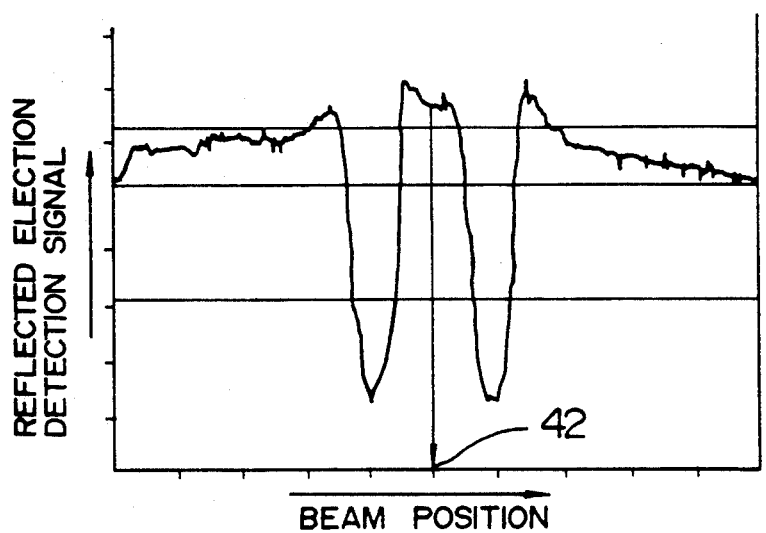
F I G. 12B
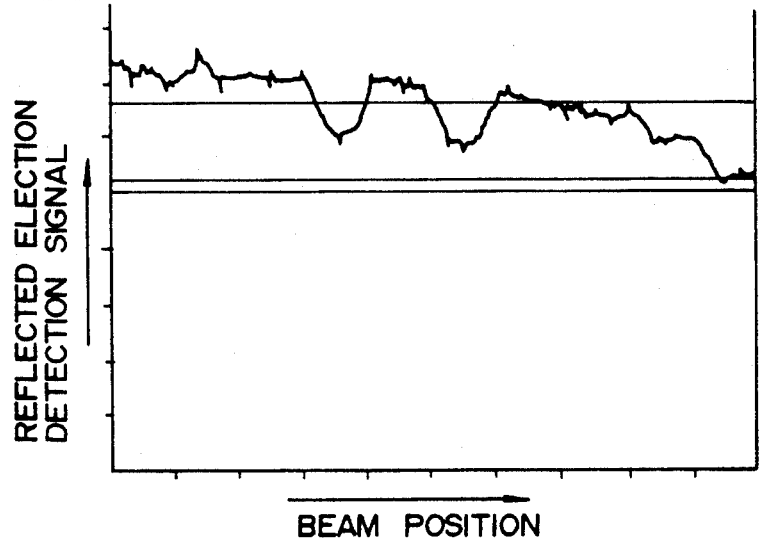
F I G. 13
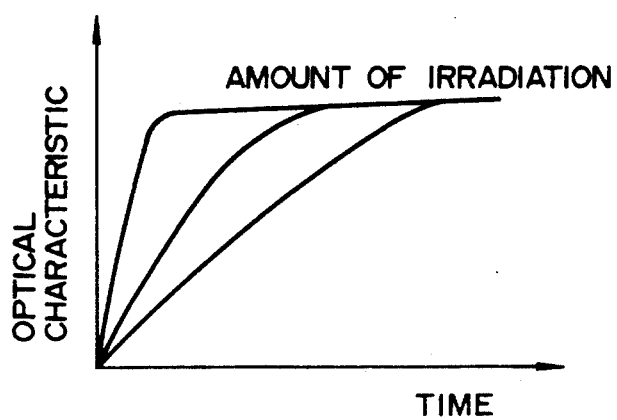

BEAM CONTROL METHOD AND APPARATUS

BACKGROUND OF THE INVENTION

The present invention relates generally to a beam control method and an apparatus for carrying out the same. More particularly, the invention is directed to a beam control method and a beam control apparatus which can be employed for depicting or drawing a pattern on a specimen such as a wafer and the like with an electron beam while suppressing the influence of drift or deviation of the electron beam from a desired or aimed position for irradiation.

With an increasing tendency to use semiconductor devices with a higher integration density, an optical exposure or irradiation apparatus and a pattern depiction apparatus for depicting or forming a fine pattern on a specimen such as a semiconductor wafer, mask or the like is imposed with more and more severe requirements relating to the capability and performance thereof. Of these apparatuses, it is expected that the optical exposure apparatus will encounter great difficulty in its application to the manufacture of semiconductor devices of the next generation. Under the circumstances, an electron beam pattern depicting apparatus adapted for drawing or depicting patterns on semiconductor specimens such as wafers by using an electron beam has been developed as an apparatus to replace the optical exposure apparatus mentioned above.

For a better understanding of the invention, description of an electron beam apparatus known heretofore will be described briefly on the assumption that the apparatus is applied for depiction of a pattern on a mask by reference to FIG. 1 of the accompanying drawings. As is shown in the figure, a mask 22 disposed on an XY-stage 21 is irradiated with an electron beam EB with the aid of an electron optical system 1, whereby a pattern is formed on the mask 22. In this type of electron beam apparatus, the position actually irradiated with the electron beam often drifts from a desired or aimed position which should originally have been irradiated, due to deviation in the position of the specimen 22 disposed on the stage 21. In an attempt to correct or cancel such deviation, a reference mark 23 is usually provided on the XY-stage 21 at a peripheral portion thereof (outside of the range of irradiation with the electron beam EB). With this arrangement, deviation or drift is corrected in a manner described below. After displacement of the XY-stage for establishing positional alignment between the electron beam EB and the reference mark 23, magnitudes of displacement of the XY-stage 21 are measured by a laser type range finding instrument 20 in the X- and Y-directions, respectively. On the basis of the displacement thus measured, magnitude and the direction of the drift in the position of the irradiating electron beam EB on the mask 22 is determined, whereon the irradiating direction of the electron beam EB is changed so that the drift can be eliminated, to thereby allow the electron beam EB to irradiate the mask 22 at the originally aimed position.

In the case of the method of controlling the position of the irradiating electron beam BE by detecting the reference mark 23, as described above by reference to FIG. 1, the stage 21 has to be moved periodically at a predetermined time interval in the course of a pattern depiction for the purpose of establishing positional alignment between the electron beam EB and the mark 23 to thereby correct or adjust the actual position of the irradiating electron beam, which, of course, results in excess time required for the pattern depiction.

In the case of an application where the specimen to be subject to the pattern depiction is a wafer, an alignment mark 34 formed on the wafer 6 is detected in place of the reference mark mentioned above, as shown in FIGS. 2A and 3 of the accompanying drawings. Parenthetically, a reference numeral 7 in FIG. 2A denotes a resist layer. Since the alignment mark 34 is positioned in the vicinity of a circuit pattern 33, the time taken for establishing the positional alignment between the electron beam and the alignment mark 34 can certainly be reduced, which, in turn, means that the time required for the correction to make the actual position irradiated with the electron beam EB and the originally aimed position coincide with each other can be correspondingly reduced. A typical one of such alignment technique is disclosed in Japanese Utility Model Application Laid-Open No. 29953/1981 (JU-A-56-29953) which may be referred to for more particulars.

It is however noted that when a multiplicity of resist layers are provided in a stacked structure, it often becomes difficult or even impossible to detect the alignment mark.

Besides, in the current status of the art, there exists inevitably a deviation $3\sigma \pm 0.2$ μm to $\pm 0.25$ μm between the actually irradiated position and the desired or aimed position (reference may be made to "Current Status of E-Beam Lithography": Bull. Japan Soc. of Prec. Engg., Vol. 22, No. 4, Dec. 1988). Accordingly, even when the alignment mark 34 can be detected, problems remain with respect to the accuracy and hence the capability of the electron beam irradiation apparatus to manufacture IC devices of the next generation. The main factors giving rise to such alignment errors include: (1) fluctuation of the beam impinging position due to vibration of a column constituting an integral part of the electron optical system, (2) variation or change in the beam impinging position under the influence of electric charge stored in a specimen (wafer, mask or the like) as well as electric charge built up internally in an electron beam lens/deflection system, (3) error involved in the detection of the alignment mark, and others. For coping with the electric charge formed in the specimen, such approach has been proposed that an electrically conductive material is contained in the resist layer.

SUMMARY OF THE INVENTION

It is therefore an object of the present invention to provide a beam control method and an apparatus for carrying out the same which are capable of correcting or cancelling out deviation possibly existing between a position actually irradiated with a beam and a desired or aimed position to be originally irradiated due to any one or combinations of the factors or causes mentioned above and which can thus irradiate an object or specimen with a beam at a significantly enhanced accuracy.

It is another object of the present invention to provide an electron beam pattern depiction method and an apparatus therefor which can profitably be used for manufacturing electronic devices of the next generation.

Still another object of the present invention is to provide an electron beam pattern depicting method and an apparatus therefor which are capable of reducing time required for the pattern depiction.

In view of the above and other objects which will be apparent as description proceeds, it is proposed according to a general aspect of the present invention that a specimen on which a pattern is to be depicted is irradiated with a first beam capable of bringing about change or modification in property of a material forming the specimen, whereon a trace on the specimen resulting from the irradiation with the first beam is irradiated with a second beam which is substantially incapable of bringing about change in the property of the specimen. Subsequently, the position or location of the trace is discriminatively determined or identified on the basis of a signal representing characteristically the trace formed by the irradiation of the first beam, which is then followed by comparison between the position of the trace and a desired or aimed position on the specimen which should have originally been irradiated, whereon the beam is controlled on the basis of the result of the comparison such that the beam can precisely be directed to the aimed position on the specimen.

BRIEF DESCRIPTION OF THE DRAWINGS

FIGS. 2A and 2B are fragmentary sectional views showing wafers on which resist is deposited in a single layer and in a multi-layer structure, respectively;

FIG. 3 is a schematic diagram showing a positional relation between circuit patterns and alignment marks both formed on a wafer;

FIGS. 8A and 8B are views for illustrating how a position actually irradiated with an electron beam can be determined on the basis of images representing the detected changes in the optical characteristic;

FIG. 9 is a graphic chart for illustrating how a drift (amount of deviation) of the position actually irradiated with the electron beam from a desired or aimed position (commanded position) can be determined;

FIGS. 12A and 12B are views for illustrating how an alignment position can be detected from a reflected electron detection signal; and FIG. 13 is a graphic chart for illustrating, by way of example, a relation of time vis-a-vis optical characteristic change with an amount of electron beam irradiation being employed as a parameter.

DESCRIPTION OF THE PREFERRED EMBODIMENTS

Now, the present invention will be described in conjunction with an electron beam pattern depicting method and an electron beam pattern depicting apparatus, by way of example only.

Figure 1:
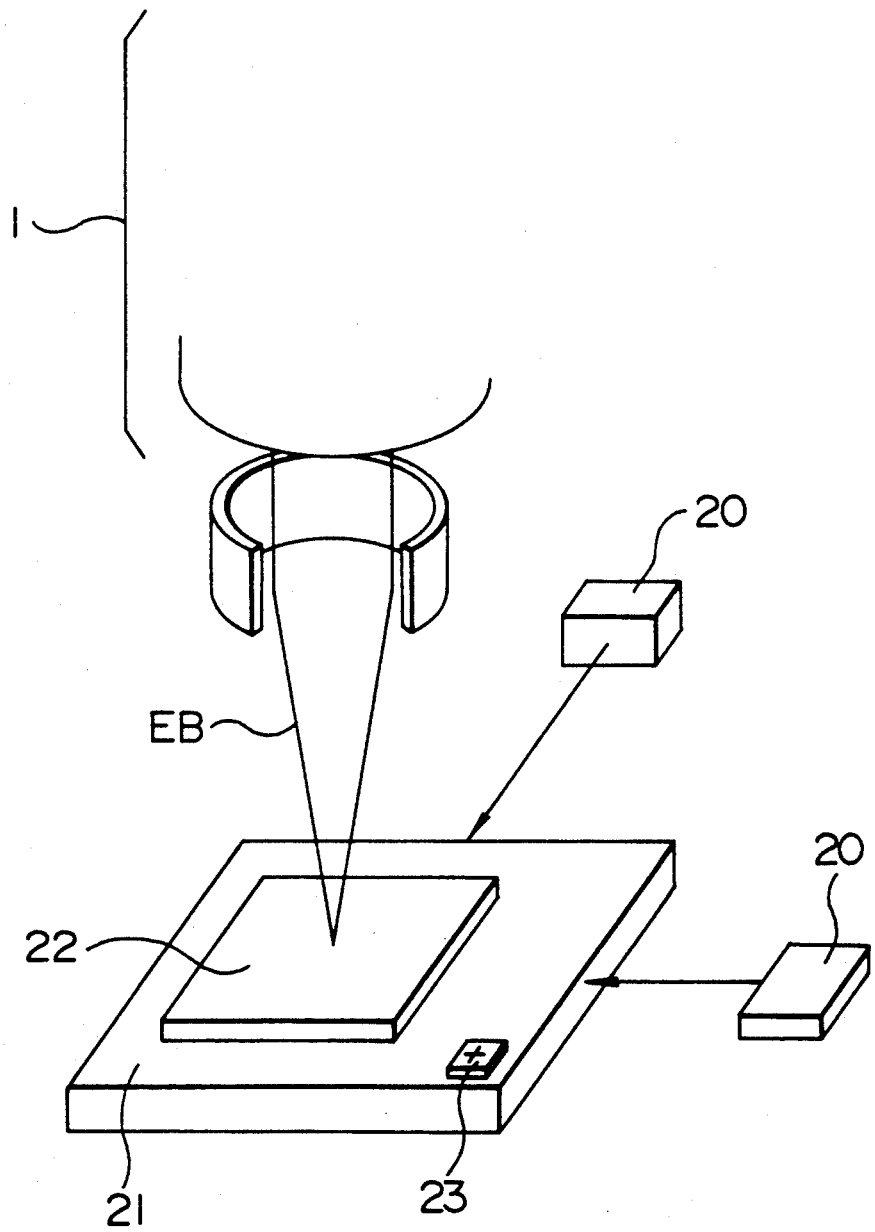
FIG. 1 is a pictorial view for illustrating schematically a hitherto known beam position correcting method which is based on the use of a reference mark.
Figure 4:
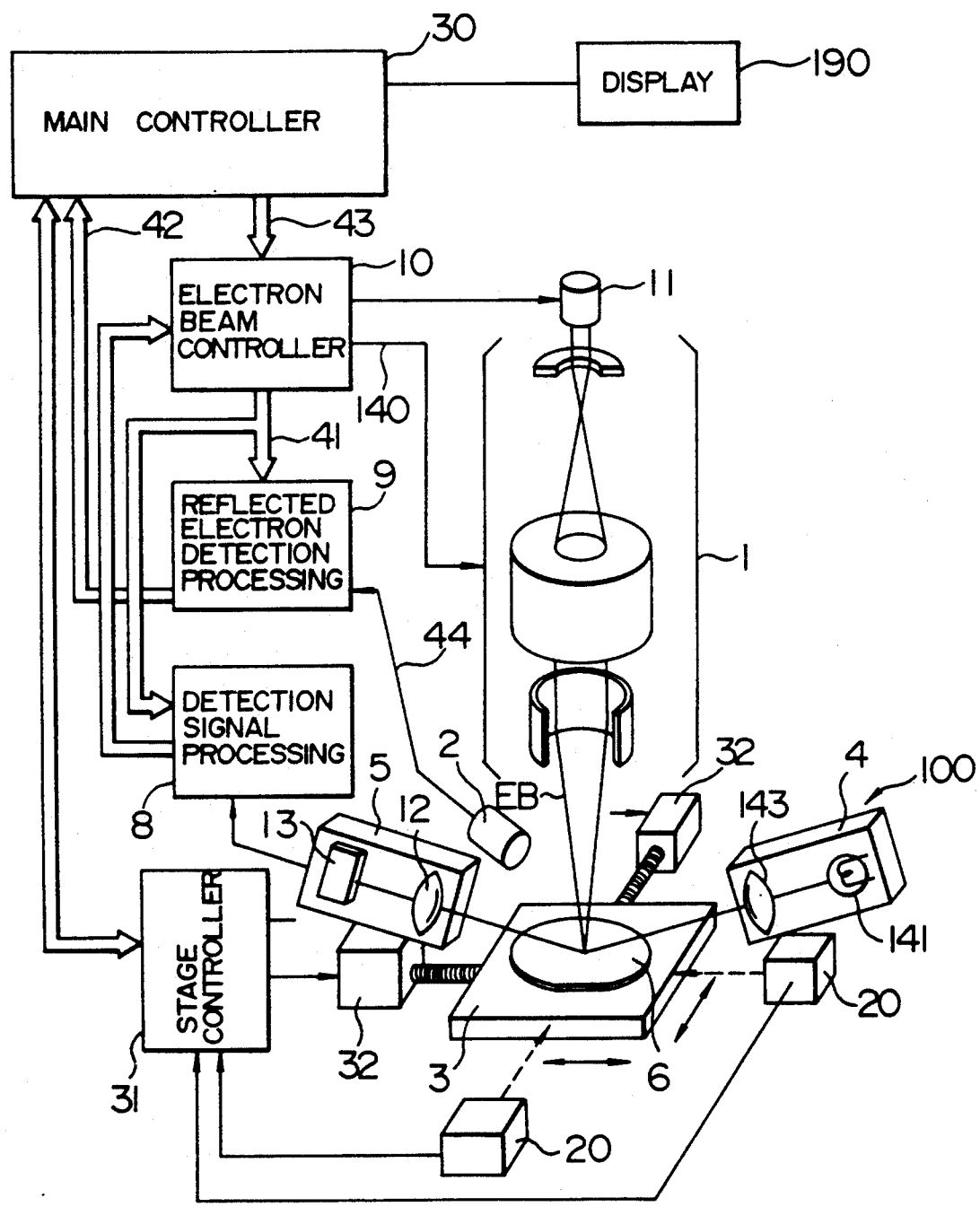
FIG. 4 is a diagram showing generally a structure of an electron beam pattern depicting apparatus according to an embodiment of the present invention.

FIG. 4 shows a structure of an electron beam pattern depicting apparatus according to an exemplary embodiment of the invention for illustrating the underlying concept thereof. As can be seen in the figure, the electron beam pattern depicting apparatus includes an electron optic system 1, a reflected electron detector 2 and an optical detection system 100 (constituted by an illuminating array 4 and a detector array 5) which are disposed around and along a periphery of a specimen stage 3 on which a wafer 6 is disposed. In the case of the illustrated embodiment, control of the position of the stage 3 in the X- and Y-directions is realized by correspondingly controlling the rotational direction of a driving electric motor 32 through a stage controller 31. The position of the stage 3 is detected with the aid of a laser-type range-finding instrument 20. The reflected electron detector 2 is so disposed as to be capable of detecting those electrons which are reflected upon irradiation by the electron beam EB of an alignment mark 34 provided in the vicinity of a circuit pattern 33 on the wafer 6 in such a manner as shown in FIG. 3. The alignment mark 34 is made use of for the initial position alignment of the electron beam EB relative to the circuit pattern 33 on the wafer 6. To this end, a reflected electron detection/processing unit 9 is provided for determining a pattern position of the alignment mark 34 relative to a reference irradiation position of the electron beam EB on the basis of a reflected electron detection signal 44 outputted from the reflected electron detector 2 and electron beam irradiation position data 41 supplied from the electron beam controller 10. The pattern position data thus obtained is supplied to a main controller 30 which responds thereto by sending out to the electron beam controller 30 the pattern depiction data prepared on the basis of the pattern position data 42. An electron gun 11 and the electron optical system 1 in turn are controlled on the basis of the pattern depiction data 43 to thereby control irradiation of the wafer 6 with the electron beam EB such that a desired circuit pattern 33 can be written or depicted on the wafer 6.

At this point, it should be recalled that the position on the wafer irradiated with the electron beam undergoes drift in the course of depiction of the circuit pattern for the reasons described hereinbefore. Although the causes or factors which bring about such drift are already known, it will be helpful for better understanding of the invention to reconsider this phenomenon.

Figure 5:
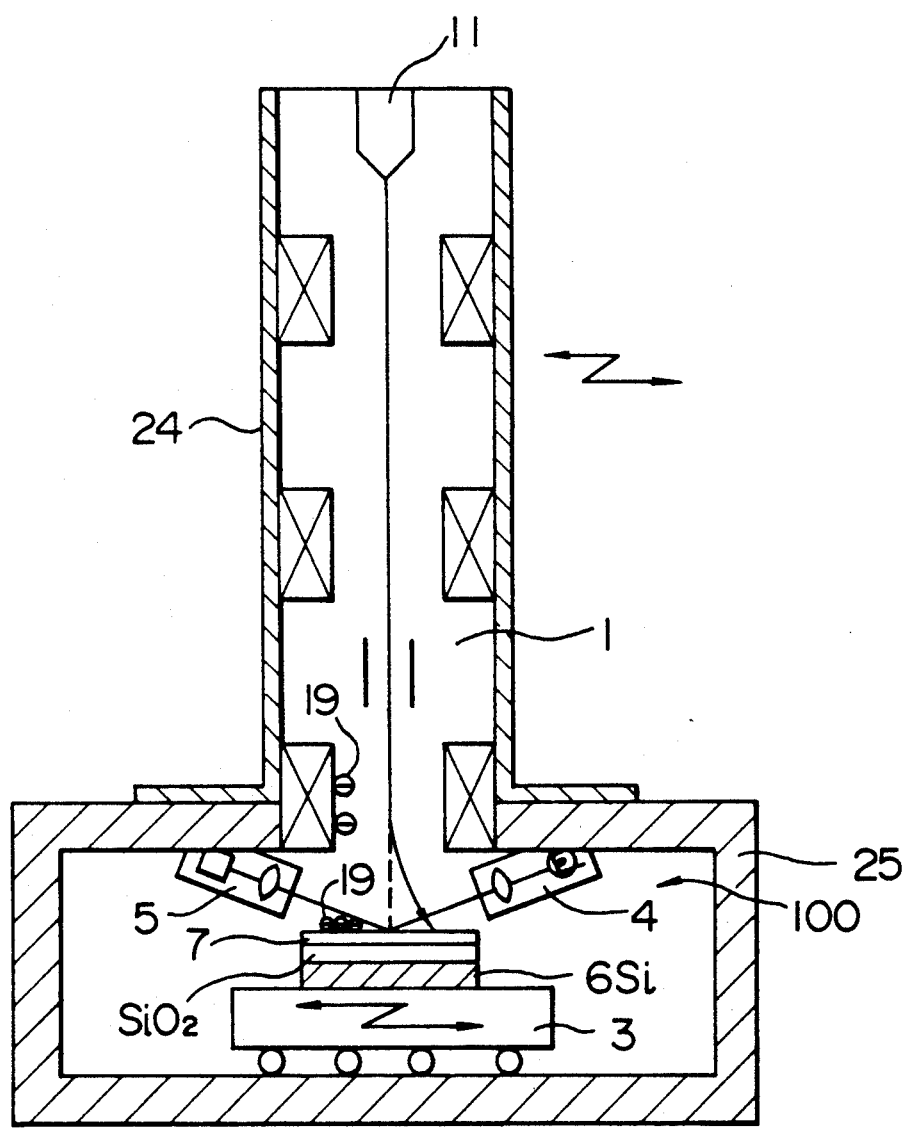
FIG. 5 is a vertical sectional view showing a structure of a main portion of the electron beam pattern depiction apparatus.

As one of the factors which give rise to the drift, the vibration of a column 24 in which the electron beam 11, the electron optic system 1 and others are incorporated is mentioned, as shown in FIG. 5. Additionally, the position irradiated with the electron beam is caused to drift under the influence of a phenomenon related to electric charges stored or accumulated internally of the wafer 6 and the lens/deflection system for the electron beam. More specifically, the interior of the lens/deflection system for the electron beam is electrically charged with negative polarity, as indicated at 19. On the other hand, the wafer 6 is usually constituted by a silicon substrate on which a SiO$_2$-layer and a resist layer 7 are deposited as electric insulations. Because of presence of these dielectrics, electric charge 19 of negative polarity appears on the surface of the resist layer 7. Under the effect of these charges, the electron beam of the negative polarity is forced to bend in such a manner as illustrated by an arrow in the figure, which results in occurrence of the drift of the position irradiated with the electron beam EB.

Heretofore, in an effort to prevent or suppress the drift, some measures have been adopted, which will be described below. A signal of the electron beam control system (e.g. value of a voltage applied to an electron lens system) is detected during the irradiation of the alignment mark 34 with the electron beam and then compared with the corresponding signal at the time when the alignment mark was initially irradiated with the electron beam. When the position currently irradiated with the electron beam is drifted or deviated from the initial position, then a difference occurs between the two signals mentioned above. By making use of this difference signal, the signal of the electron beam control system is corrected so as to cancel out the difference. More specifically, by taking into account magnitude of the bending of the electron beam as well as the direction in which the beam is bent, the electron beam is projected with a deviation from the aimed position which is to be irradiated with the electron beam. For effectuating this correction, the alignment mark 34 has to be periodically irradiated with the electron beam.

However, with the hitherto known correction or control method described above, high-accuracy control could not be accomplished in any satisfactory manner because of the incapability to correct the drift components brought about by the vibration of several Hz which is insusceptible to absorption even by an air pad. At this juncture, FIG. 5 shows generally a mechanical structure including the electron optic system 1, an irradiating system 4, the detector 5, the stage 3 and others which are shown in FIG. 2, wherein a base 25 mounted beneath the electron optic system 1 accommodates components others than those of the electron optic system 1. In particular, the illuminating unit 4 and the detector 5 are fixedly secured to an inner wall of the base 25.

Now according to the teachings of the present invention incarnated in the illustrated embodiment, a trace formed on the specimen surface as a result of a physical or chemical process performed thereon through irradiation of the electron beam EB is optically detected by the optical signal processing system 8 as an actually beam-irradiated position (by deriving center position data of a signal waveform produced upon optical detection of a change in the optical characteristic of the specimen). This actually irradiated position is compared with the desired or aimed position of the trace which should originally have been formed on the basis of depiction pattern data outputted from a main control system 30 if no drift took place at all. On the basis of deviation between the two positions mentioned above, an electron beam irradiation control signal 140 is correspondingly corrected so that the position on the specimen surface at which a pattern should originally be depicted can be irradiated with the electron beam. Accordingly, in the case of the electron beam pattern depicting apparatus according to the instant embodiment of the invention, the reflected electron detector 2 and the reflected electron detection/processing system 9 do not constitute the components indispensably required for implementation of the present invention but serve simply for auxiliary functions.

Now, description will made in more concrete of the pattern depiction according to the teachings of the invention.

Referring to FIGS. 4 and 5, a unit 100 constituted by the illuminating array 4 and the detector array 5 and serving for detection of the position irradiated with the electron beam EB is fixedly secured to an inner wall of the base 25 in such disposition as not to interfere with the irradiation of the electron beam. More specifically, the illuminating array 4 is composed of a light source 141 and a projecting optic 143 and serves to illuminate a trace formed on a specimen or wafer surface as a result of irradiation with the electron beam. This optical illumination should preferably be carried out at a position which immediately succeeds the position where the wafer surface has just been irradiated with the electron beam.

Figure 7A:
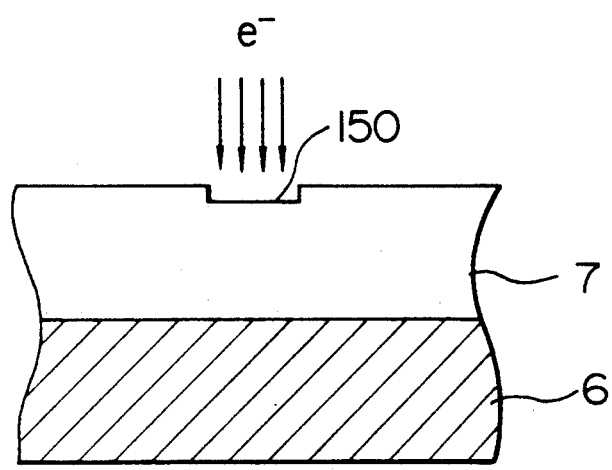
FIGS. 7A and 7B are fragmentary sectional views of a wafer having a resist layer deposited thereon for illustrating in what manners optical characteristic or property of the resist undergoes changes upon irradiation with an electron beam, respectively.
Figure 7B:
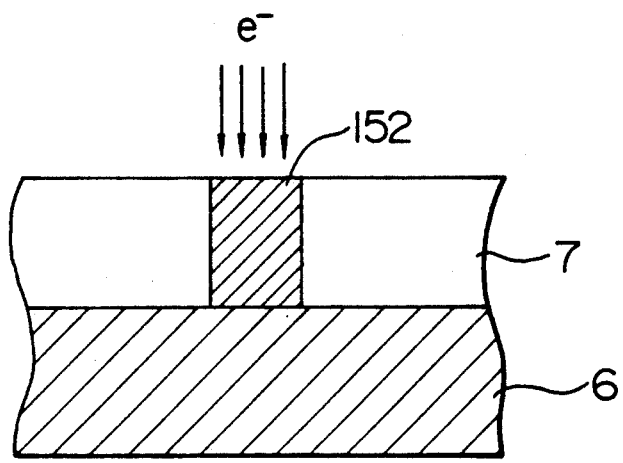

FIGS. 7A and 7B show examples of the trace formed as a result of the irradiation with the electron beam. A trace 150 shown in FIG. 7A is formed by accelerated electrons impinging on the resist layer 7 which then undergoes a change in the geometrical configuration to thereby form the trace 150. On the other hand, FIG. 7B shows a trace 152 formed as a result of change in the optical properties (change in the light absorption coefficient, reflection index, refraction index and the like) brought about by the irradiation with the electron beam.

The light beam projected from the illuminating array 4 is reflected on the specimen surface to be detected by the light detector array 5, which may be constituted by an optical detection lens system 12 and a photoelectric sensor 13. The latter may be so implemented as to produce a two-dimensional or one-dimensional output. FIG. 8A shows schematically a two-dimensional output of the optical sensor 13, while FIG. 8B shows an output waveform of the optical sensor 13 implemented in a one-dimensional configuration. A hatched area shown in FIG. 8A and a valley of the waveform shown in FIG. 8B indicate a trace formed in the specimen as a result of the irradiation with the electron beam. More specifically, the trace formed in the resist layer by the electron beam irradiation differs from the remaining portion of the resist layer in respect to the physical and/or chemical property, which difference is reflected as that of the optical property of the light beam reflected from the trace and results in a corresponding change in the output of the photoelectric sensor 13. Let's consider in more detail the photoelectric sensor by taking as example that of the one-dimensional configuration. FIG. 9 shows an output waveform of that sensor. Referring to the figure, the center $d_1$ of a valley or through of the waveform coincides with the center of the trace formed as a result of the irradiation of the electron beam with a detection accuracy of less than $\pm 0.02$ $\mu$m. (In this conjunction, reference may be made to a Japanese literature entitled "1990 Guide Books of Apparatuses for Manufacturing and Testing VLSI" published Nov. 10, 1988 as a separate volume of DENSHI ZAIRYO (ELECTRONIC MATERIALS), pp. 80-86.)

Figure 10A:
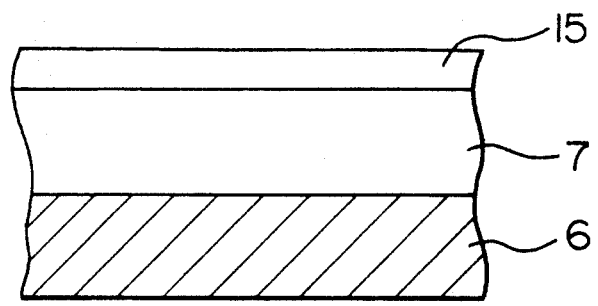
FIGS. 10A, 10B and 10C are schematic sectional views of specimens in which coating materials each susceptible to significant change in their optical characteristic are applied at different locations relative to a resist layer, respectively.
Figure 10B:
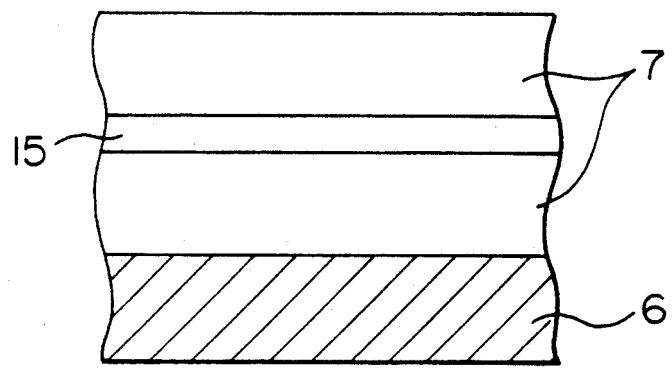
Figure 10C:
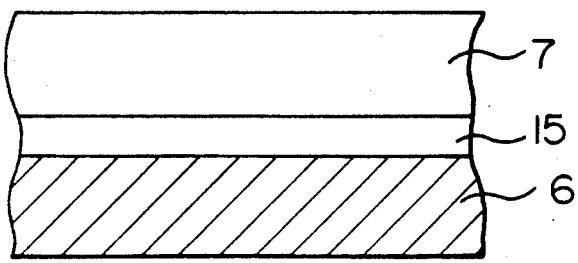

In case the change in the optical property of the resist layer brought about by the irradiation with the electron beam is insufficient to characteristically identify the trace, it is preferred to use a coating material 15 which can undergo significant change in the optical property due to irradiation with the electron beam, as illustrated in FIGS. 10A, 10B and 10C, which show wafer structures including coating material layers 15 deposited on the top, intermediate and the bottom of the resist 7, respectively.

At this juncture, it should be mentioned that the trace formed by the irradiation with the electron beam and detected by the optical detection system 100 may be displayed on a display device 190. In that case, operator can visually compare the position of the actually formed trace with that of a trace to be originally formed, and when the difference between these trace positions exceeds a permissible range, he or she may stop the processing for the purpose of adjusting or correcting the position to be irradiated with the electron beam. Of course, the difference of concern may be arithmetically determined, the result of which can be displayed on the display device 190. Further, it is preferred to activate an alarm when the difference of concern exceeds the permissible range.

Figure 11:
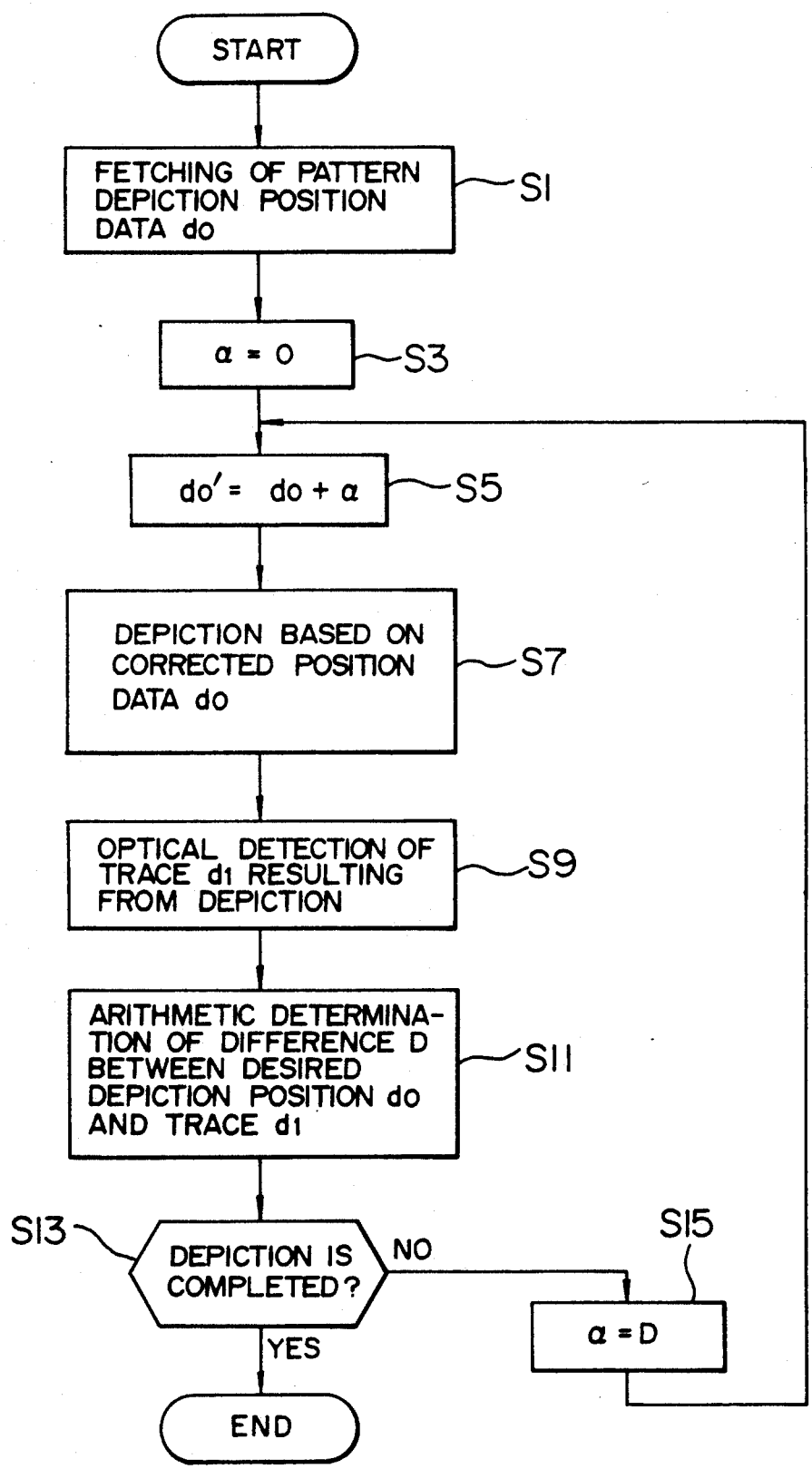
FIG. 11 is a flow chart for illustrating operation of the electron beam pattern depicting apparatus according to an embodiment of the invention.

Next, referring to FIG. 11 in combination with FIG. 6, description will be made of operation of the electron beam type pattern depicting apparatus according to an embodiment of the invention. For the sake of simplification of the description, it is assumed that deviation in the position irradiated with the electron beam makes appearance in a one-dimensional form (see FIG. 9).

The electron beam control system 10 incorporates a memory 111 which contains data of patterns to be depicted. At first, this pattern data is read out (step 1). Subsequently, an irradiation control signal 140 is generated on the basis of the pattern data read out from the memory 111 without performing any correction (at steps 3 and 5), which data are then supplied to the electron optic system 1 for carrying out the pattern depiction with the electron beam.

Figure 6:
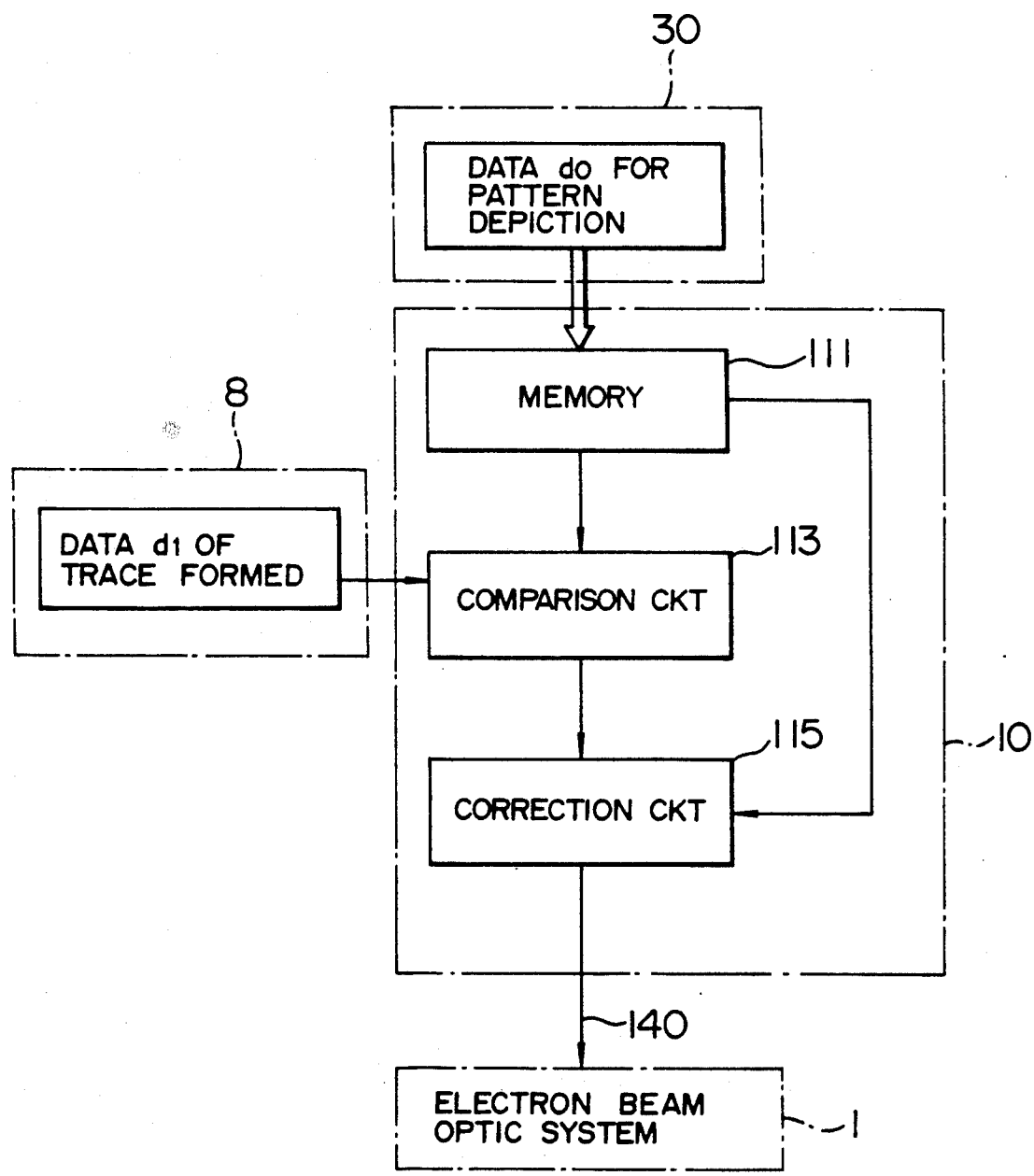
FIG. 6 is a circuit block diagram schematically showing a general arrangement of a beam control processing circuit which can be employed in the electron beam pattern depicting apparatus according to an embodiment of the invention.

At a step 9, the trace formed as the result of irradiation is detected by the optical detection system 100, whereon the center position $d_1$ of the change in the optical property is determined as the center of the formed trace with the aid of the optical signal processing system 8 to be subsequently outputted to a comparator circuit 113 (FIG. 6). At a step 11, the position $d_0$ (to-be-depicted position data) where the trace is originally to be formed is compared with the actually formed trace $d_1$ to thereby determine arithmetically a difference D between $d_0$ and $d_1$.

On the basis of the difference D thus obtained, the signal 140 for controlling the succeeding electron beam irradiation is corrected correspondingly (steps 15, 5). Consequently, the position which is actually irradiated with the electron beam through the electron optical system 1 can be aimed while taking into account a deviation corresponding to the difference D from the position $d_0$ which is to be originally irradiated unless the difference D made appearance. The operation described above can be performed continuously or repeatedly until depiction of a pattern has been completed.

By virtue of the electron beam control method described above, the irradiation with the electron beam can be controlled substantially on a real-time basis because of the capability of feeding back constantly the difference D between the position $d_1$ of the actually formed trace and that $d_0$ of the trace to be originally formed. Thus, by setting the time taken for the feedback at a value less than about 10 ms, correction of the drift can be effectuated even in the state where the column resonates at a frequency lower than several Hz. Of course, the time for the feedback may be established arbitrarily. Besides, the control described above may be periodically performed at a predetermined time interval.

In connection with a mask pattern depiction or wafer pattern depiction where a multiplicity of resist layers is used, it is noted that the reflected electron detection signal (refer to FIG. 12B) produced in response to the detection of the alignment mark undergoes relatively insignificant change when compared with the reflected electron detection signal (FIG. 12A) produced upon detection of the alignment mark shown in FIG. 2A, as a result of which the mark detection accuracy may significantly be degraded, which would possibly lead to such situation that detection of the alignment mark becomes impossible. In contrast, the optical detection system according to the illustrated embodiment of the invention can satisfactorily be employed for detecting the alignment mark even in the case mentioned above.

By the way, for the detection of change in the optical properties or characteristics which the resist, coating material or the like has experienced during the irradiation with the electron beam, it is preferable to measure beforehand the change in the optical characteristics of these materials. Such measurement can easily be effectuated with a structure of the measuring apparatus such as shown in FIG. 4. This apparatus is so arranged as to measure the change in the optical characteristic as a function of time lapse with the amount of electron beam irradiation being used as a parameter. FIG. 13 shows, by way of example only, a time vis-à-vis optical characteristic change with the amount of electron beam irradiation being used as a parameter. Since this figure is self-explanatory, any further description will be unnecessary.

In the foregoing, the present invention has been described in conjunction with the electron beam pattern depicting method and the apparatus therefor. It should however be appreciated that the beam irradiating method and apparatus according to the invention are never restricted to the application such as the pattern depiction. With the phrases "beam irradiating method and apparatus" used herein, it is intended to cover such processing methods and apparatus in which an ion beam, a laser beam, a molecule beam, an atom beam, an X-ray beam or the like is made use of, admitting that the structure of the beam irradiation system differs more or less in dependence on the species of the beams used for the irradiation. In these beam processing apparatuses, it is often observed that the actual position irradiated by the beam is deviated from the aimed or desired beam position. Accordingly, the beam irradiation method according to the invention can be adopted for making the actual position irradiated with any one of the beams of the types mentioned above coincide with the aimed position which is to be originally or intrinsically irradiated with the beam, because so far as any change can be produced in the optical characteristic of a target material of concern as a result of irradiation with any one of the beams enumerated above, it is possible to correct the position to be irradiated with the beam on the basis of the result of the detected change in the optical characteristic. Of course, for application of the beam irradiating method according to the invention to a given one of the beam processing apparatuses of the types enumerated above, there may be required some modification such that a surface of a material to be processed or worked is first irradiated with a beam of feeble intensity, for detecting the position irradiated. The purpose of using the beam of such low intensity for the preparatory irradiation is to protect the material surface against formation of any undesirable trace or injury due to that irradiation. The portion of the material undergone some change in the optical property thereof as a result of the irradiation of the low intensity beam is then confirmed through detection by the optical detecting system shown in FIG. 4. The actual processing can then be performed after having corrected the beam irradiation control signal in accordance with the result of the confirmation.

Parenthetically, in conjunction with the processing of a specimen surface with a molecule or atom beam, it is noted that molecules or atoms have to be previously ionized before being projected onto the specimen surface. In that case, difficulty is generally encountered in constricting the beam diameter. Thus, for irradiation of a specimen surface with a molecule or atom beam, the molecules or atoms are previously ionized, whereon the beam is shaped as desired by using a beam shaping mask and then projected onto the specimen surface through a deflecting system. In that case, immediately before the molecules or atoms has reached the specimen surface, they tend to be neutralized. Through the irradiation effected in this manner, pattern depiction on the specimen surface can be realized. Such pattern depiction process may also be adopted even in the electron beam pattern depiction apparatus, when occasion requires. In this case, beam shaping means and an aperture corresponding to a mask may be employed in the electron beam pattern depiction apparatus as well with a view to enhancing the throughput. In that case, the electron beam can be shaped properly by the aperture such that a greater area on the specimen can be irradiated by the electron beam, whereby the time taken for the electron beam to scan the specimen surface can be shortened to advantage.

Finally, in conjunction with usage of the terms, it should be added that the term "irradiation" be so interpreted as to cover "illumination".

We claim:

1. An apparatus for depicting a circuit pattern on a resist spread on a substrate by irradiating an electron beam thereon, comprising:
    table driving means for shifting a table on which the substrate is disposed at least two-dimensionally in X-Y directions;
    laser-type range-finding means for detecting a range in shift of the table at least in the X-Y directions;
    electron beam irradiation means for irradiating the substrate with a focused electron beam by utilizing deflection electrodes which are controlled by a control signal;
    an alignment mark formed on the substrate or the table;
    reflection electron detection means for detecting reflection electrons;
    primary adjustment means for
        locating the alignment mark by
            controlling the table driving means,
            irradiating the alignment mark with the electron beam by the electron beam irradiation means, and
            detecting the reflection electrons from the alignment mark by the reflection electron detection means,
        calculating a relative deviation between an irradiated position corresponding to the beam, which is determined by a position signal derived from the reflection electron detection means, and a table position of the table, which is determined by the laser-type range-finding means, and
        relatively correcting the deviation such that the irradiated position is primarily adjusted;
    depiction means for moving the table to a predetermined position by controlling the table moving means, and performing scan-type irradiation on the resist of the substrate with the electron beam by controlling the deflection electrodes of the electron beam irradiation means according to predetermined depicting pattern data in the X-Y directions such that a predetermined circuit pattern is depicted on the resist of the substrate, the depicting means performing when the primary adjustment of the beam is maintained;
    latent image detection means for
        irradiating a surface of the resist on which the pattern is depicted with a light beam,
        detecting a reflection light beam from a depicted portion of the resist as a latent image in the X-Y directions on the basis of a change in physical volume or a change in optical properties thereof,
        converting the latent image into an image signal in the X-Y directions, and
        detecting the image signal;
    electron beam drift-size calculation means for extracting at least a coordinate of a straight line component in the X-Y direction from the image signal detected by the latent image detection means, and calculating a drift-size between the coordinate and the depicting pattern data used for the depiction means; and,
    electron beam drift-correction means for correcting the control signal for the deflection electrodes of the electron beam irradiation means on the basis of the drift-size calculated by the electron beam drift-size calculation means when the depiction means performs.

2. The apparatus according to claim 1, further comprising display means for displaying the drift-size calculated by the electron beam drift-size calculation means.

3. The apparatus according to claim 1, wherein the electron beam irradiation means further includes an aperture for determining a shape of the electron beam.

4. The apparatus according to claim 1, wherein the latent image detection means includes means for irradiating the alignment mark with the light beam, detecting the reflection light beam as a light image and converting the beam into a second image signal in the X-Y directions, a basic position of the second image signal being determined on the basis of the position signal derived from the reflection electron detection means.

5. An apparatus for depicting a circuit pattern on a resist spread on a substrate by irradiating an electron beam thereon, comprising:
    table driving means for shifting a table on which the substrate is disposed at least two-dimensionally in X-Y directions;
    laser-type range-finding means for detecting a range in shift of the table at least in the X-Y directions;
    electron beam irradiation means for irradiating the substrate with a focused electron beam by utilizing deflection electrodes which are controlled by a control signal;

an alignment mark formed on the substrate or the table;

reflecting electron detection means for detecting reflection electrons;

primary adjustment means for
  locating the alignment mark by
    controlling the table driving means,
    irradiating the alignment mark with the electron beam by the electron beam irradiation means and
    detecting the reflection electrons from the alignment mark by the reflection electron detection means,
  calculating a relative deviation between an irradiated position corresponding to the beam, which is determined by a position signal derived from the reflection electron detection means, and a table position of the table, which is determined by the laser-type range-finding means, and
  relatively correcting the deviation such that the irradiated position with the beam is primarily adjusted;

depiction means for moving the table to a predetermined position by controlling the table moving means and performing scan-type irradiation on the resist of the substrate with the electron beam by controlling the deflection electrodes of the electron beam irradiation means according to predetermined depicting pattern data in the X-Y directions such that a predetermined circuit pattern is depicted on the resist of the substrate, the depicting means performing when the primary adjustment of the beam is maintained;

latent image detection means for
  irradiating a surface of the resist on which the pattern is depicted with a light beam,
  detecting a reflection light beam from a depicted portion of the resist as a latent image in the X-Y directions on the basis of a change in physical volume or a change in optical properties thereof,
  converting the latent image into an image signal int he X-Y directions and
  detecting the image signal;

electron beam drift-size calculation means for extracting at least a coordinate of a straight line component in the X-Y direction from the image signal detected by the latent image detection means, and calculating drift-size between the coordinate and the depicting pattern data used for the depiction means; and, alarm means for alarming if the drift-size calculated by the electron beam drift-size calculation means exceeds a predetermined threshold level when the depiction means performs.

6. The apparatus according to claim 5, further comprising display means for displaying the drift-size calculated by the electron beam drift-size calculation means.

7. The apparatus according to claim 5, wherein said electron beam irradiation means further includes an aperture for determining the shape of the electron beam.

8. The apparatus according to claim 5, wherein the latent image detection means includes means for irradiating the alignment mark with the light beam, detecting the reflection light beam as a light image and converting the beam into a second image signal in the X-Y directions, a basic position of the second image signal being determined on the basis of the position signal derived from the reflection electron detection means.

9. A method for depicting a circuit pattern on a resist spread on a substrate by irradiating an electron beam pattern thereon, comprising the steps of:

shifting a table on which the substrate is disposed at least two-dimensionally in X-Y directions by table driving means;

detecting a range in shift of the table at least in the X-Y directions by laser-type range-finding means;

locating an alignment mark formed on the substrate or the table by
  controlling the table driving means,
  irradiating the alignment mark with a focused electron beam by an electron beam irradiation means, which has deflection electrodes controlled by a control signal, and
  detecting deflection electrons from the alignment mark by a reflection electron detection means;

calculating a relative deviation between an irradiated position corresponding to the beam, which is determined by a position signal derived from the reflection electron detection means, and a table position of the table which is determined by the laser-type range-finding means;

relatively correcting the deviation such that the irradiated position with the beam is primarily adjusted;

moving the table to a predetermined position by controlling the table moving means, performing scan-type irradiation on the resist of the substrate with the electron beam by controlling the deflection electrodes of the electron beam irradiation means according to predetermined depicting pattern data in the X-Y directions such that a predetermined circuit pattern is depicted on the resist of the substrate, irradiating a surface of the resist on which the pattern is depicted with a light beam, detecting a reflection light beam from a depicted portion of the resist as a latent image in the X-Y directions on a basis of a change in physical volume or a change in optical properties thereof, converting the latent image into an image signal in the X-Y directions and detecting the image signal by latent image detection means, the steps of depicting the pattern and detecting the image signal being executed when primary adjustment of the beam is maintained;

extracting at least a coordinate of a straight line component in the X-Y direction from the image signal, and calculating a drift-size between the coordinate and the depicting pattern data used for the step of depicting pattern; and correcting the control signal for the deflection electrodes of the electron beam irradiation means on the basis of the drift-size when the depiction means performs.

10. The method according to claim 9, wherein the resist on the substrate includes a layer capable of large change in optical properties.

11. The method according to claim 9, further comprising the step of displaying the drift-size.

12. The method according to claim 9, further comprising irradiating the alignment mark with the light beam, detecting the reflection light beam as a light image and converting it into a second image signal in the X-Y directions, and determining a basic position of said second image signal on the basis of the position signal derived from the reflection electron detection means.

13. A method for depicting a circuit pattern on a resist spread on a substrate by irradiating an electron beam thereon, comprising the steps of:

shifting a table on which the substrate is disposed at least two-dimensionally in X-Y directions by table driving means;

detecting a range in shift of the table at least in the X-Y directions by laser-type range-finding means;

locating an alignment mark formed on the substrate or the table by controlling the table driving means, irradiating the alignment mark with a focused electron beam by an electron beam irradiation means, which has deflection electrodes controlled by a control signal, and detecting reflection electrons from the alignment mark by a reflection electron detection means;

calculating a relative deviation between an irradiated position corresponding to the beam, which is determined by a position signal derived from the reflection electron detection means, and a table position of the table which is determined by the laser-type range-finding means;

relatively correcting the deviation such that the irradiated position is primarily adjusted.

moving the table to a predetermined position by controlling the table moving means, performing scan-type irradiation on the resist of the substrate with the electron beam by controlling the deflection electrodes of the electron beam irradiation means according to predetermined depicting pattern data in the X-Y directions such that a predetermined circuit pattern is depicted on the resist of the substrate, irradiating a surface of the resist on which the pattern is depicted with a light beam, detecting a reflection light beam from a depicted poriton of the resist as a latent image in the X-Y directions on a basis of a change in physical volume or a change in optical properties thereof, converting the latent image into an image signal in the X-Y directions and detecting the image signal by latent image detection means, the steps of depicting the pattern and detecting the image signal being executed when primary adjustment of the beam is maintained.

extracting at least a coordinate of a straight line component in the X-Y direction from the image signal, and calculating a drift-size between the coordinate and the depicting pattern data used for the step of depicting pattern; and alarming if the drift-size exceeds a predetermined threshold level.

14. The method of claim 13, wherein the resist on the substrate includes a layer capable of large changes in optical properties.

15. The method according to claim 13, further comprising the step of displaying the drift-size.

16. The method according to claim 13, further comprising irradiating the alignment mark with the light beam, detecting the reflection light beam as a light image and converting it into a second image signal in the X-Y directions, determining a basic position of the second image signal on a basis of the position signal derived from the reflection electron detection means.

* * * * *